(12) United States Patent
Naffziger et al.

(10) Patent No.: US 7,599,458 B2
(45) Date of Patent: Oct. 6, 2009

(54) SYSTEM AND METHOD TO REDUCE JITTER

(75) Inventors: Samuel D. Naffziger, Fort Collins, CO (US); Steven F. Liepe, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 751 days.

(21) Appl. No.: 10/968,735

(22) Filed: Oct. 19, 2004

(65) Prior Publication Data

US 2006/0083341 A1 Apr. 20, 2006

(51) Int. Cl.
*H04L 7/00* (2006.01)

(52) U.S. Cl. .................. 375/371; 375/226; 375/375; 375/349; 702/69; 370/516; 370/517; 370/518; 384/497

(58) Field of Classification Search ............... 375/371, 375/226, 375, 376, 349; 702/69; 386/497; 370/516, 517, 518; 384/497
See application file for complete search history.

(56) References Cited

U.S. PATENT DOCUMENTS

| | | | |
|---|---|---|---|
| 6,094,082 A | 7/2000 | Gaudet | |
| 6,121,808 A | 9/2000 | Gaudet | |
| 6,380,774 B2 * | 4/2002 | Saeki | 327/119 |
| 6,564,359 B2 * | 5/2003 | Saeki | 716/5 |
| 6,642,760 B1 | 11/2003 | Alon et al. | |
| 6,693,496 B1 | 2/2004 | Lebouleux | |
| 6,771,107 B2 | 8/2004 | Saeki | |
| 6,784,714 B2 | 8/2004 | Nakamura | |
| 6,900,676 B1 * | 5/2005 | Tamura | 327/156 |
| 7,103,855 B2 * | 9/2006 | Saeki | 716/1 |
| 7,266,169 B2 * | 9/2007 | Zhang | 375/375 |
| 7,295,578 B1 * | 11/2007 | Lyle et al. | 370/503 |
| 2003/0099321 A1 | 5/2003 | Juan et al. | |
| 2003/0152181 A1 | 8/2003 | Stengel et al. | |
| 2004/0057546 A1 | 3/2004 | Badets et al. | |
| 2005/0060616 A1 * | 3/2005 | Cho et al. | 714/34 |

OTHER PUBLICATIONS

John G. Maneatis, "Low-Jitter Process-Independent DLL and PLL Based on Self-Biased Techniques", IEEE Journal of Solid-State Circuits, vol. 31, No. 11, Nov. 1996, pp. 1723-1732.
David J. Foley and Michael P. Flynn, "A 3.3V, 1.6GHz, Low-Jitter, Self-Correcting DLL Based Clock Synthesizer in 0.5um CMOS", (date unknown).
"A Low Jitter, Fast Locking Delay Locked Loop Using Measure and Control Scheme", (Author and date unknown).

* cited by examiner

*Primary Examiner*—Mohammad H Ghayour
*Assistant Examiner*—Nader Bolourchi

(57) ABSTRACT

One disclosed embodiment may comprise an interpolation system that includes an interpolator that interpolates between a selected phase from a preceding cycle and a selected phase from a current cycle to provide an interpolated phase for the current cycle. An edge of the interpolated phase for the current cycle has reduced jitter relative to an edge of a corresponding phase of the current cycle. A delay system delays a plurality of other phases of the current cycle to provide delayed other phases, the delayed other phases and the interpolated phase for the current cycle collectively defining a set of adjusted phases for the current cycle.

30 Claims, 4 Drawing Sheets

_US 7,599,458 B2_

SYSTEM AND METHOD TO REDUCE JITTER

BACKGROUND

In many high-speed data applications, a clock edge is employed to capture or propagate data. Clock jitter is a deviation from an ideal timing of clock transition events, such as a rising or falling clock edge. Cycle-to-cycle jitter is a type of jitter that corresponds to variations in the period of a clock signal. The cycle-to-cycle jitter of a clock cycle can result in variations (e.g., a reduction) in the clock period or a decrease in frequency over time. Jitter can result from many sources, the dominant ones being supply noise in the distribution and cross-coupling from interconnect in the on-chip distribution. As an example, Delay locked loops (DLL's) and other circuitry can be employed to generate clock signals. A DLL as well as other associated circuitry can introduce cycle-to-cycle jitter into the clock signal. The jitter in the clock signal can decrease the available frequency and otherwise degrade performance by circuitry that is controlled by the jittering clock.

SUMMARY

One embodiment of the present invention may comprise an interpolation system that includes an interpolator that interpolates between a selected phase from a preceding cycle and a selected phase from a current cycle to provide an interpolated phase for the current cycle. An edge of the interpolated phase for the current cycle has reduced jitter relative to an edge of a corresponding phase of the current cycle. A delay system delays a plurality of other phases of the current cycle to provide delayed other phases, the delayed other phases and the interpolated phase for the current cycle collectively defining a set of adjusted phases for the current cycle.

Another embodiment may comprise a system that includes a delay locked loop that provides a multi-phase signal based on a reference clock signal. An interpolation system includes an interpolator that interpolates between an edge of a selected phase of the multi-phase signal from a preceding cycle and an edge of a selected phase of the multi-phase signal from the current cycle to provide an edge for an interpolated first phase of the current cycle of the multi-phase signal. A delay system delays a plurality of edges of the multi-phase signal to provide a plurality of delayed phases of the multi-phase signal. The plurality of delayed phases and the interpolated first phase of the current cycle collectively define an adjusted multi-phase signal for the current cycle. The adjusted multi-phase signal for the current cycle has reduced jitter relative to the multi-phase signal provided by the delay locked loop.

Yet another embodiment may comprise a system that includes means for interpolating between an edge of a phase from a preceding cycle of a multi-phase signal and an edge of a phase from a current cycle of the multi-phase signal to provide an adjusted edge for an interpolated phase of the current cycle of the multi-phase signal. The system may also include means for delaying other phases of the multi-phase signal to provide a plurality of delayed phases for the current cycle of the multi-phase signal, the plurality of delayed phases and the interpolated phase of the current cycle being combined to provide an adjusted multi-phase signal for the current cycle.

Still another embodiment may comprise a method that includes receiving a multi-phase signal having a plurality of phases, each of the plurality of phases having a respective edge that exhibits an amount of jitter. The method also includes interpolating between the edge of a selected phase of a preceding cycle of the multi-phase signal and an edge of a selected phase of a current cycle to provide an interpolated clock edge that exhibits a reduced amount of jitter relative to the amount of jitter associated with the received multi-phase signal.

DETAILED DESCRIPTION

Figure 1:
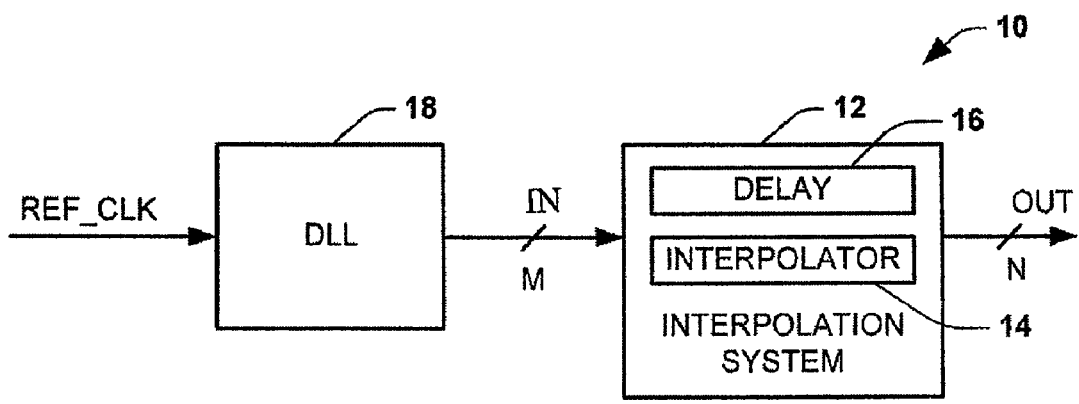
FIG. 1 depicts an embodiment of a system.

FIG. 1 depicts an example of a system 10 that can be utilized to mitigate jitter in a multi-phase output signal, indicated at OUT. The jitter can be cycle-to-cycle jitter. Additionally or alternatively, the jitter can correspond to a relative deviation from an ideal timing of a clock transition event, such as a rising or falling clock edge, which defines a given cycle of the multi-phase output signal OUT. The multi-phase signal OUT can include any number N of phases, where N is a positive integer (e.g., N≧2), which can be provided on one or more lines. Each of the N phases of the multi-phase signal can be shifted a fractional part of a cycle (e.g., $1/N^{th}$ of a cycle) relative to each adjacent phase. The system 10 includes an interpolation system 12 that generates the OUT signal based on an input signal, indicated at N. The input signal IN has a plurality of M phases, where M is a positive integer (e.g., M≧2). The interpolation system 12 is operative to reduce jitter between the OUT signal and the multi-phase input signal by interpolating between clock phases associated with two different cycles of clock signal.

The interpolation system 12 thus includes an interpolator 14 that is configured to interpolate between a clock edge of a selected phase of a preceding clock cycle and a clock edge of a selected phase of a next (e.g., current) clock cycle. The interpolator 14 provides an interpolated clock edge as a beginning phase of the multi-phase output signal OUT. The interpolated edge has reduced jitter relative to a corresponding edge of the multi-phase input signal for the current cycle that is being interpolated because it averages the arrival times of the previous and current cycle's first clock edge.

A delay system 16 is operative to delay the other phases of the multi-phase input IN. The delay system 16 can introduce an amount of delay (e.g., a dummy delay) that is substantially matched to the amount of delay associated with the interpolator 14 performing the interpolation. For example, the delay system 16 can introduce the delay with respect to M−1 of the phases of the input IN signal. The interpolation system 12 combines the M−1 delayed multi-phase signals with the interpolated phase from the interpolator 14 to provide an adjusted multi-phase output signal OUT. The adjusted multi-phase output signal can be combined in a single output or it can be defined by a plurality of N output lines. The interpolation provides for reduced jitter in the multi-phase output signal OUT when compared relative to the multi-phase input signal IN due to the averaging affect on input clock arrival times provided by the interpolation between previous and current clock signals. In a case where a single stage of interpolation and jitter attenuation is implemented, the combined multiphase output signal can be provided as the output signal OUT (e.g., M=N). Alternatively, the combined multi-phase signal can be an intermediate signal, which is further processed by the interpolation system 12 to increase the number of phases (e.g., M>N) by implementing additional interpolation or by employing other means for increasing the number of phases. For instance, the interpolation system 12 can have a plurality of interpolation/delay stages such that N=M*$2^K$, where K is a positive integer denoting the number of interpolation stages in the interpolation system 12.

By way of context, a delay locked loop (DLL) 18 can provide the multi-phase input signal IN to the interpolation system 12 based on a reference clock (REF_CLK). Those skilled in the art will understand and appreciate various implementations of DLLs that can be utilized to provide the multi-phase input signal IN to the interpolation system 12. For example, the DLL 18 can be an open loop or closed loop DLL. By employing the interpolation system 12 in combination with the DLL 18, the jitter in the multi-phase output signal that provided by the DLL 18 (e.g., the input signal IN to the interpolation system 12) can be mitigated in the resulting output signal OUT.

Figure 2:
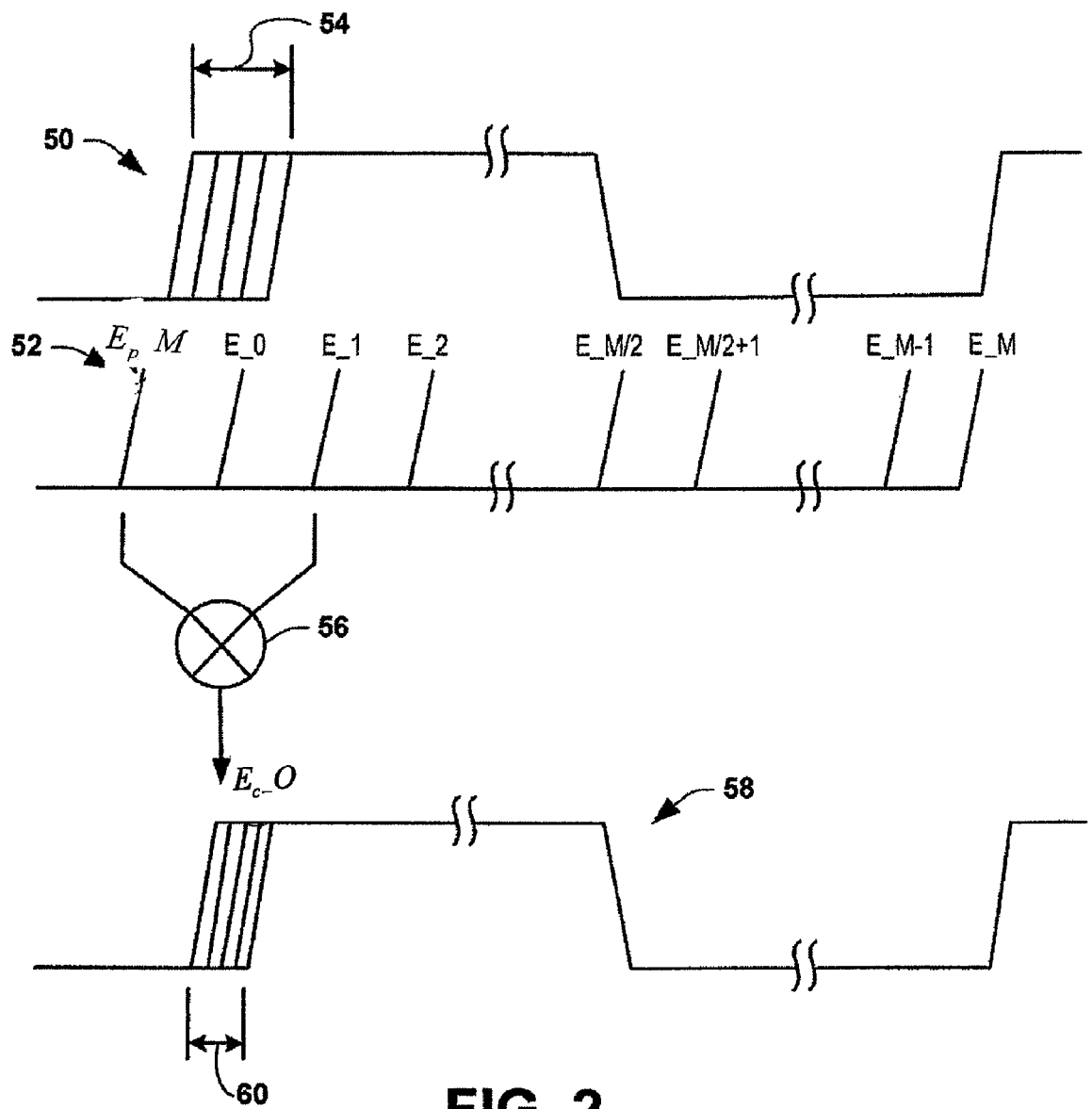
FIG. 2 depicts a functional timing diagram for an embodiment of interpolation.

FIG. 2 depicts a functional representation of interpolation performed relative to a multi-phase input signal, such as can be provided by a DLL. In FIG. 2, a beginning phase (phase 0) of the multi-phase input signal is indicated at 50 and corresponding edges of the multi-phase input signal are depicted at 52. The multi-phase signal 52 depicted in FIG. 2 includes an edge from a preceding cycle and edge E_0 through edge E_M of a current cycle. Each edge is associated with a respective phase of the multi-phase input signal 50. For example, edge E_0 is associated with the beginning phase (phase 0) of the multiphase input signal 50. As depicted in FIG. 2, an amount of jitter, indicated at 54, is associated with a rising edge E_0. The amount of jitter 54 can be characterized as a function of time (e.g., represented in picoseconds). This jitter 54 can arise from noise in the distribution and cross-coupling from interconnect in the on-chip distribution.

An interpolator 56 interpolates between a selected phase E_1 of the current cycle and a selected phase $E_{p\_}$M of the preceding cycle to provide an interpolated or a beginning phase 58 of a corrected clock cycle. In the example, of FIG. 2, the interpolation is performed between selected rising edges, although interpolation could alternatively be performed between selected falling edges. By way of further example, assuming that the number of phases M=7 (i.e., there are eight phases in the multi-phase signal 52), the interpolation 56 would produce an interpolated (or corrected) edge $E_{C\_}$0. The interpolated edge $E_{C\_}$0 can correspond to an average of edge E_1 of the current clock cycle and edge E_7 of the preceding clock cycle. By interpolating between selected edges of the preceding and current clock cycle, the amount of jitter 60 associated with the interpolated clock edge $E_{C\_}$0 of the beginning phase 58 can be reduced, such as reduced by a factor of two.

The reduction in the jitter 60 associated with the beginning phase edge $E_{C\_}$0 at the output of the interpolator 56 enables associated circuitry to achieve corresponding frequency improvements based on the output of an interpolation system, such as shown in FIG. 1. The improvements further can be maintained even when further interpolation is performed to increase the number of phases, as described herein. Additionally, those skilled in the art will appreciate that the approach described herein can be implemented for multi-phase signal having any number of edges in a given cycle.

Figure 3:
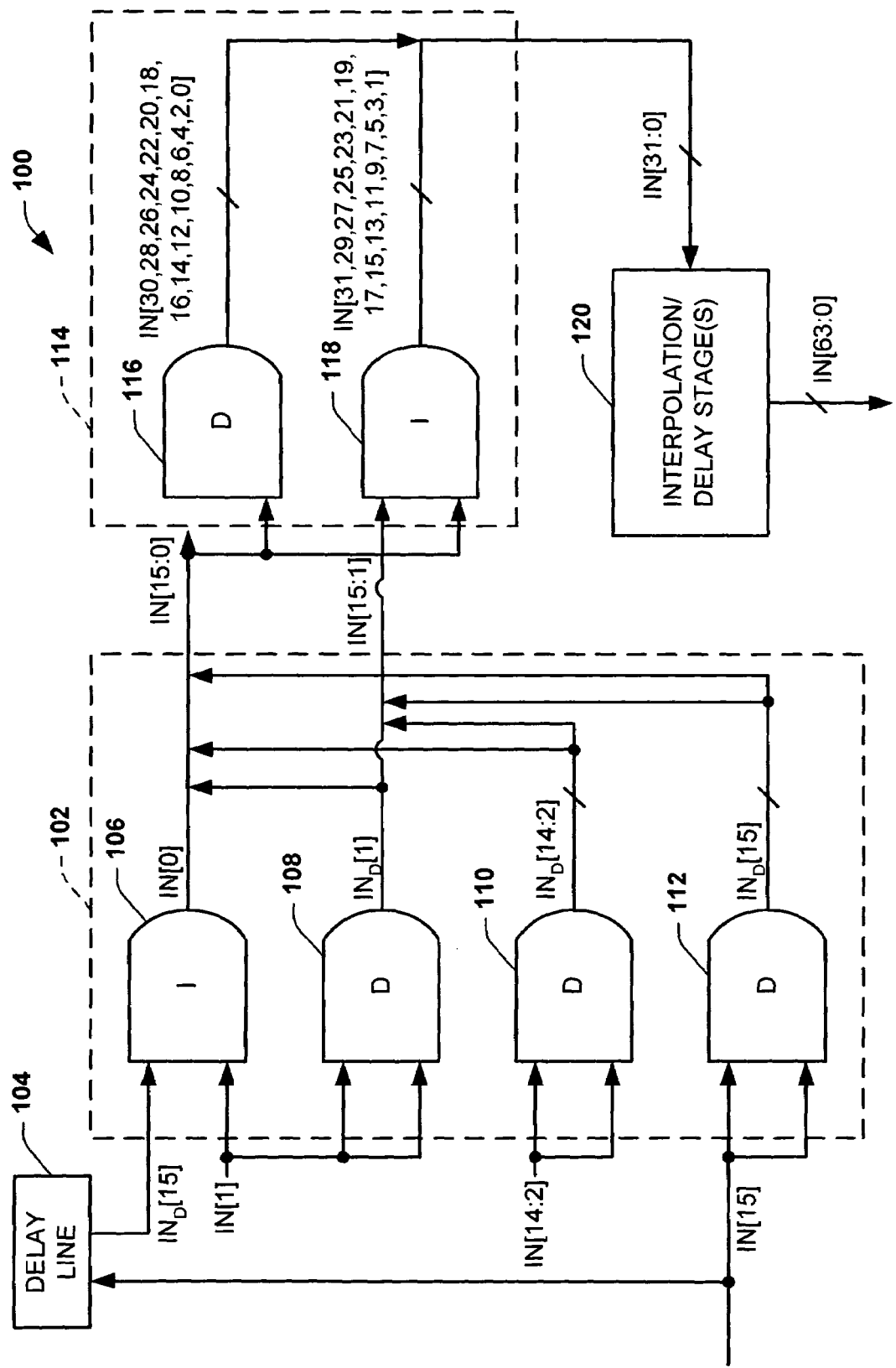
FIG. 3 depicts an embodiment of an interpolation system.

FIG. 3 depicts an example of an interpolation system 100 that can be implemented to reduce jitter of a multi-phase signal. In the example of FIG. 3, it is assumed that a 16 phase multi-phase input signal IN[15:0] is received by the interpolation system 100. A first stage 102 of the interpolation system 100 receives phase of a preceding phase as well as current phases IN[1:15] of the multi-phase input signal. Phase 0 of the current multi-phase input signal can be discarded, as it is not required by the first stage 102. A delay component 104 can be utilized to delay phase IN[15] to provide a delayed phase $IN_D$[15] from a preceding clock cycle. The delay component 104 is configured to implement a desired amount of delay so as to provide the delayed phase $IN_D$ [15] from the preceding clock cycle to the first stage 102 of the interpolation system 100. Those skilled in the art will understand and appreciate various types of hardware, such as buffers, a delay line, latches, registers, other components or combinations thereof that can be utilized to implement the delay component 104.

The first stage 102 of the interpolation system 100 includes an interpolation block 106 and three delay blocks represented at 108, 110 and 112 that collectively form a delay system for other signals IN[15:1] of the multi-phase input signal. The interpolator 106 interpolates between $IN_D$ [15] and IN[1] to provide a corresponding interpolated phase IN[0]. The delay block 108 implements delay relative to IN[1] to provide a delayed version of $IN_D$[1]. The delay block 110 performs delay relative to a plurality of the other multi-phases IN[14:2] to provide a delayed version thereof indicated at $IN_D$[14:2]. The delay block 112 similarly performs a delay relative to the last phase $IN_D$[15] of the multi-phase input to provide a delayed version thereof.

The corresponding outputs of the interpolation block 106 and the delay blocks 108, 110 and 112 collectively define a corrected multi-phase cycle having reduced jitter relative to the multi-phase input signal IN[15:0] provided to the interpolation system 102 (e.g., from a DLL). The collective signal IN[15:0] is provided to a second stage 114 of the interpolation system. The second stage 114 is configured to perform interpolation on the multi-phase input IN[15:0] to provide a corresponding finer grain multi-phase input indicated at IN[31:0].

In the example of FIG. 3, the second stage 114 of the interpolation system 100 includes a delay block 116 and an interpolation block 118. The delay block 116 is operative to provide a delayed version of the multi-phase input signal IN[15:0] indicated at IN[30, 28, 26, 24, 22, 20, 18, 16, 14, 12, 10, 8, 6, 4, 2, 0]. The interpolation block 118 receives the multi-phase input signal IN[15:0] as one input. The interpolation block 118 also receives another multi-phase input IN[15:1] from the first stage 102 corresponding to a subset of the aggregated multi-phase output from the first stage the corrected signal, excluding phase 0. The interpolation block 118 thus interpolates between the respective inputs IN[15:0] and IN[15:1] to provide the corresponding interpolated output, indicated at IN[31, 29, 27, 25, 23, 21, 19, 17, 15, 13, 11, 9, 7, 5, 3, 1]. Each of the respective edges provided by the interpolator block 118 substantially corresponds to an average of the respective edges of adjacent phases IN[15:0]. The multi-phase outputs from the delay block 116 and the interpolation block 118 are aggregated to provide the multi-phase output IN[31:0].

The interpolation system 100 can also include one or more additional interpolation/delay stages 120 operative to perform additional interpolation and delay on the multi-phase signal IN[31:0] provided by the second stage 114. The interpolation/delay stages 120 can be employed to provide a finer grain multi-phase signal when finer granularity is required. In the example of FIG. 3, the interpolation/delay stages provide a 64 phase output signal, indicated at [63:0], by performing interpolation and delay on the multi-phase input IN[31:0]. The interpolation and delay performed by the interpolation/delays stages 120 can be substantially similar to that shown and described with respect to the second stage 114. However, those skilled in the art will understand that about twice the number of components generally will be required for performing the delay and interpolation relative to the 32 phases in the output signal IN[31:0] of the second stage 114 than to perform the interpolation delay on the sixteen-phase output IN[15:0] provided by the first stage 102.

Figure 4:
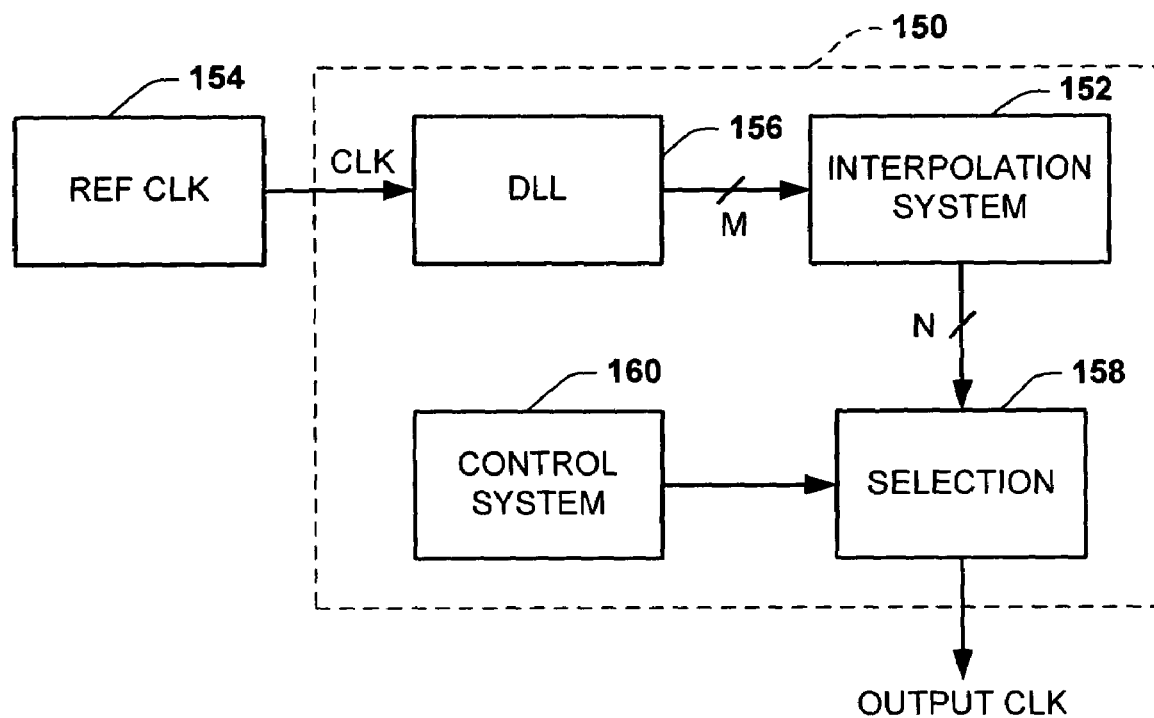
FIG. 4 depicts an embodiment of a frequency synthesizer that includes an interpolation system.

FIG. 4 depicts an example of a frequency synthesizer 150 implementing an interpolation system 152. The interpolation system 152 is operative to provide a multi-phase output signal having a plurality of N phases based on a multi-phase input signal having a plurality of M phases, where $N \geq M$. Those skilled in the art will understand and appreciate various ways that the interpolation system 152 can be implemented to mitigate jitter based on the teachings contained herein.

A reference clock generator 154 is operative to provide a reference clock signal CLK to a DLL 156. The reference clock signal CLK has a predetermined substantially fixed clock cycle. The reference clock generator 154 can be implemented as part of an integrated circuit that includes the DLL 156 or it can be separate external circuitry. The DLL 156 is operative to generate a multi-phase signal based on the reference clock signal. The multi-phase output signal from the DLL 156, for example, can include a plurality of M substantially equal phases having substantially the same frequency but phase shifted relative to each adjacent or sequential phase by a factor of 1/M of the clock cycle of the reference clock signal CLK. Thus, the multi-phase signal has substantially the same clock cycle as the reference clock signal CLK.

The interpolation system 152 performs interpolation, such as described herein, to provide a corresponding multi-phase output signal having N phases. Each of the plurality of N phases is phase shifted relative to each adjacent phase by approximately 1/N of cycle for the reference clock signal CLK, such that N substantially equally phase-shifted signals are provided for each cycle. The interpolation system 152 performs interpolation between a selected edge (e.g., edge M) of a preceding clock cycle and a selected edge (e.g., edge 1) of the current clock cycle to provide an adjusted edge of a beginning phase (e.g., edge 0). The adjusted edges can correspond to an average of the selected edges. The interpolation system 152 can also interpolate the other edges in the current clock cycle to maintain a desired phase difference between such other edges and the adjusted edge (e.g., edge 0). As a result of performing such interpolation and delay, cycle-to-cycle jitter can be mitigated.

As described herein, N can be equal to M, such as when the interpolation system 152 is employed to mitigate jitter without further increasing the number of phases. Alternatively, N can be greater than M, such as when the interpolation system 152 includes multiple interpolation stages, at least one of which stages is operative to generate additional intermediate phases between adjacent phases.

The interpolation system 152 thus provides the N phases to a selection system 158. A control system 160 provides a control signal to the selection system 158 for selecting from the N available phases to provide a corresponding output clock signal (OUTPUT CLK) having a desired frequency and phase shift. For example, the control system 160 may store a current phase shift data that is associated with the current output clock signal. The control system 160 can also be configured to determine a phase shift to facilitate selecting edges for a next output clock signal.

Those skilled in the art will understand and appreciate various ways in which the frequency of the output clock signal can be increased or decreased based upon logic implemented by the control system 160. For example, the control system can implement state logic that is operative to track the state of the system 150, with phase logic being performed to select appropriate edges from the N phases. By way of a further example, the state logic can store frequency division data that facilitates selecting from the N plurality of phases for changing the frequency of the output clock signal. The phase shifting and frequency selection performed by the control system 160 thus can be implemented based on the state logic for selectively adjusting the frequency of the output clock based upon the frequency division data. Since the cycle-to-cycle jitter is mitigated in the N phases provided by the interpolation system, the frequency of the output clock signal can maintain improved accuracy in the clock cycle at increased frequencies (e.g., for high speed clocks).

Figure 5:
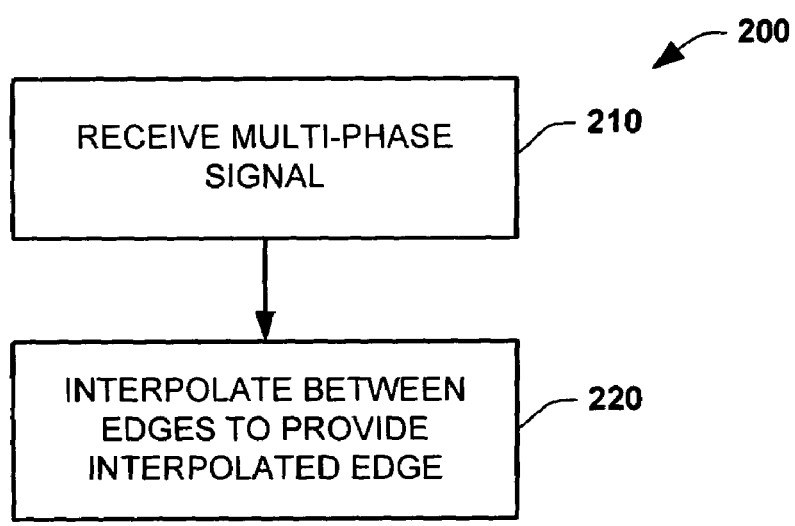
FIG. 5 is flow diagram depicting an embodiment of a method.
Figure 6:
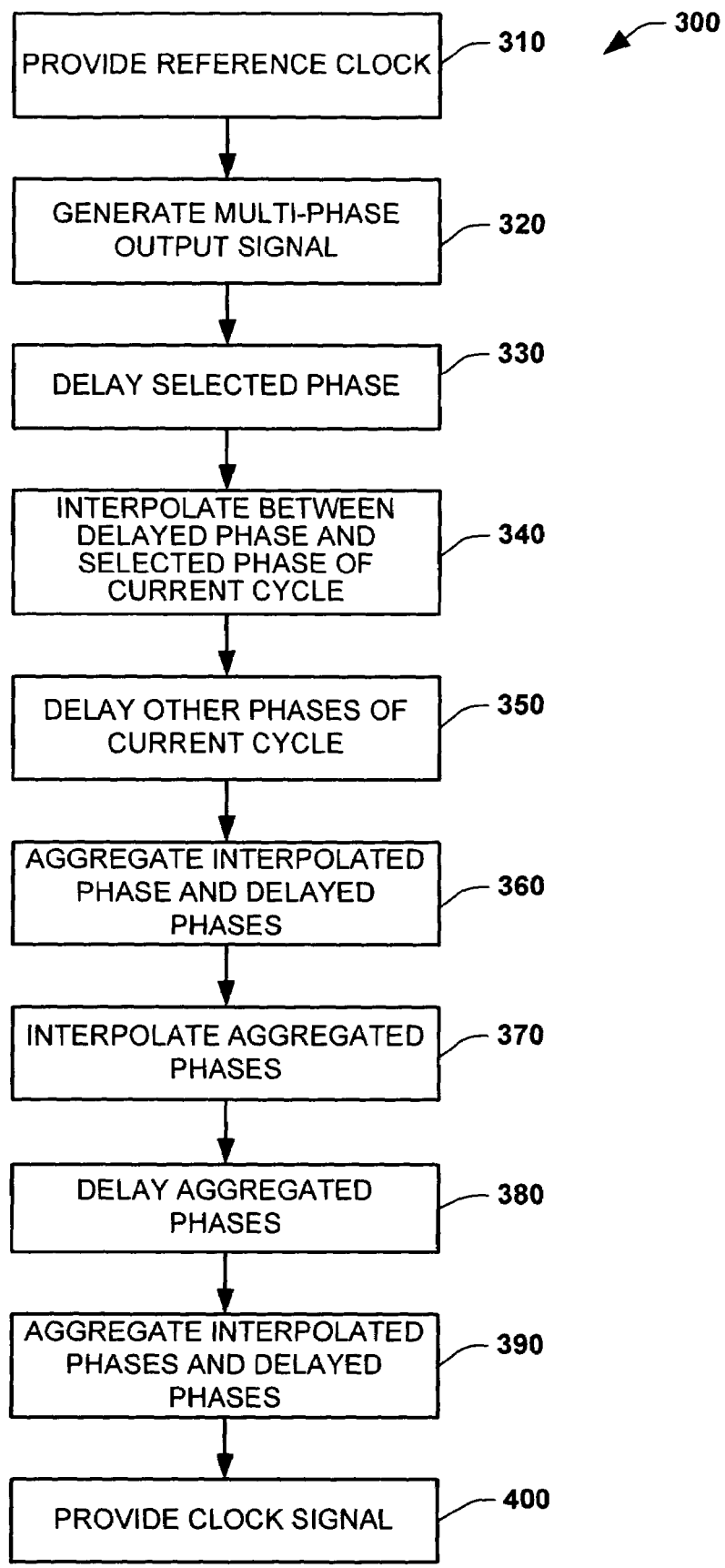
FIG. 6 is a flow diagram depicting another embodiment of a method.

In view of the foregoing structural and functional features described above, certain methods will be better appreciated with reference to FIGS. 5 and 6. It is to be understood and appreciated that the illustrated actions, in other embodiments, may occur in different orders and/or concurrently with other actions. Moreover, not all illustrated features may be required to implement a method. It is to be further understood that the following methodologies can be implemented in hardware (e.g., logic gates, such as including transistors, a digital signal processor, or application specific integrated circuit), software (e.g., as executable instructions running on one or more processors), or any combination of hardware and software.

FIG. 5 depicts a method 200. The method 200 may include receiving a multi-phase signal having a plurality of phases, each of the plurality of phases having a respective edge that exhibits an amount of jitter, as shown at 210. At 220, the method includes interpolating between the edge of a selected phase of a preceding cycle of the multi-phase signal and an edge of a selected phase of a current cycle to provide an interpolated clock edge that exhibits a reduced amount of jitter relative to the amount of jitter associated with the received multi-phase signal.

FIG. 6 depicts an example of a method that can be utilized to reduce jitter associated with a multi-phase signal. The method 300 begins at 310 in which a reference clock signal is generated. The reference clock signal provides a basis or reference cycle time that can be utilized for generating the multi-phase output signal. Each phase of the multi-phase signal is a fractional part of the cycle of the reference clock signal. At 310, a multi-phase output signal is generated. The multi-phase output signal, for example, can be provided by a DLL, such as may form part of a frequency synthesizer or other circuitry that might employ a DLL. As described herein, a DLL can introduce significant cycle-to-cycle jitter in the multi-phase signal relative to the reference clock signal, especially at high frequencies (e.g., in the GHz range).

At 330, a selected phase of the multi-phase output provided at 320 is delayed to provide a corresponding delayed version of the selected phase. This delayed version thus corresponds to a phase of a preceding clock cycle. At 340, interpolation is performed between a selected phase of the present cycle and the delayed phase provided at 330. For instance, each of the selected phases of the current cycle and the delayed phase of the previous cycle are selected to be phase-shifted a same number of phases relative to a beginning edge (or edge 0) of the current clock cycle. Thus, the interpolation at 340 results in an interpolated phase corresponding to an edge 0 of the current cycle, such as corresponding to an average between the edges being interpolated.

At 360, other phases of the present cycle are delayed. The amount of delay implemented at 350 can be configured to be substantially matched to the amount of delay that is associated with performing the interpolation at 340. At 360, the interpolated beginning phase of the current cycle (provided at 340) and the delayed other phases (provided at 350) are aggregated to provide a corresponding multi-phase signal having reduced cycle-to-cycle jitter (e.g., reduced by a factor of 2) relative to the amount of jitter associated with the multi-phase output signal provided at 320.

From 350, the method may proceed to 370, 380 and 390 to perform additional interpolation to provide finer grain resolution of edges in the clock cycle (e.g., a greater number of phases than the aggregated multi-phase signal provided at 360. For example, at 370, interpolation can be performed on the aggregated multi-phase signal provided at 360 to provide a corresponding multi-phase signal. The interpolated version of the multi-phase single can have the same number of phases as the aggregated multi-phase signal provided at 360, but in which the respective edges of the phases in the interpolated output signal provided at 370 correspond to the average edges of adjacent signals of the aggregated multi-phase signal at 360. At 380, the aggregated phases in the multi-phase signal provided at 360 are delayed by an amount that approximates the delay associated with performing the interpolation at 370.

At 390, the interpolated signals at 360 and the delayed multi-phase signals at 370 are aggregated to provide a finer grain multi-phase signal in which the interpolated multi-phase signals at 370 are interleaved in time with the delayed multi-phase signals provided at 380. Those skilled in the art will understand and appreciate that the interpolation, delay and aggregation associated with 370, 380 and 390 can be performed any number of times to provide a desired granularity of the phases for each reference clock signal. Alternatively, other forms of interpolation can be performed to increase the granularity of the multi-phase output signal that is provided at 360.

After the desired granularity and number of phases is provided at 390, the method proceeds to 400 in which a corresponding output clock signal can be generated. The output clock signal can be generated at 400 to have a desired frequency and phase shift by selecting (e.g., multiplexing) phases from the multi-phase output signal to a corresponding clock output or bus. Those skilled in the art will understand and appreciate that by implementing the interpolation at 340 to mitigate jitter, more consistent clock cycle can be provided at 400.

By way of example, assuming that jitter associated with the multi-phase output provided at 320 consumes approximately 5% of a clock cycle provided at 400, which is typical for high frequency microprocessors, a factor of two jitter attenuation by the interpolation at 340 can result in about a 2.5% frequency improvement. Those skilled in the art will understand and appreciate that the jitter reduction implemented by the method 300 can be applied to various types of systems in which it is desirable to mitigate jitter associated with a multi-phase signal. For example, the method 300 can be applied to multi-phase outputs provided by DLLs in a variety of implementations, such as communications implementations, microprocessor implementations and so forth.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. An interpolation system comprising:
    an interpolator that phase interpolates between a selected phase from an adjacent preceding clock cycle and a selected phase from a current clock cycle to provide an interpolated phase for the current clock cycle, wherein the interpolated phase for the current clock cycle has reduced jitter relative to a corresponding phase of the preceding clock cycle; and
    a delay system that delays the selected phase from the current clock cycle to correspond with the selected phase of the preceding clock cycle, the delay system further delaying a plurality of other phases of the current clock cycle to provide delayed other phases, where the amount of delay of the other phases is configured to substantially match an amount of delay associated with the interpolation, the delayed other phases and the interpolated phase for the current clock cycle collectively defining a set of adjusted phases for the current clock cycle.

2. The system of claim 1, wherein the interpolator and the delay system define a first stage of the system, the system further comprising at least one other stage operative to further increase a number of phases for the current cycle based on the set of adjusted phases for the current cycle.

3. The system of claim 2, wherein the at least one other stage comprises:
    at least one interpolator that interpolates between respective pairs of the adjusted phases for the current cycle to provide a set of interpolated phases for the current cycle; and at least one delay system that delays the adjusted phases for the current cycle to provide a delayed set of adjusted phases for the current cycle, the delayed set of adjusted phases for the current cycle being combined with the set of interpolated phases for the current cycle to provide a corresponding set of phases for the current cycle that is greater in number than the set of adjusted phases for the current cycle provided by the first stage.

4. The system of claim 3, wherein the at least one interpolator of the at least one other stage interpolates between edges from each adjacent pair of phases in the set of adjusted phases for the current cycle to provide the set of interpolated phases for the current cycle with corresponding edges that are aligned substantially intermediate each of the adjacent pair of phases in the set of adjusted phases for the current cycle, such that number of phases in the corresponding set of phases for the current cycle is about twice the number of phases in the set of adjusted phases for the current cycle provided by the first stage.

5. The system of claim 1, further comprising a delay component that delays the selected phase of the preceding cycle to provide a delayed phase from the preceding cycle, the interpolator interpolating between the delayed phase from the preceding cycle and the selected phase from the current cycle to provide the interpolated phase for the current cycle.

6. The system of claim 1, wherein the interpolator interpolates between an edge of the selected phase from the preceding cycle and an edge of the selected phase from the current cycle to provide an interpolated edge for a first phase in the set of adjusted phases for the current cycle, the interpolated edge for the first phase in the set of adjusted phases for the current cycle having reduced jitter relative to a corresponding edge of a first phase of the current cycle.

7. The system of claim 6, wherein the edge of the selected phase from the preceding cycle and the edge of the selected phase from the current cycle are rising edges.

8. The system of claim 1, wherein the preceding cycle and the set of adjusted phases for the current cycle have an equal number of phases, the selected phase from the preceding cycle corresponding to a last phase of the preceding cycle and the selected phase from the current cycle corresponding to a second phase of the current cycle, such that the interpolation between the selected phase from the preceding cycle and the selected phase from the current cycle provides a first phase in the set of adjusted phases for the current cycle.

9. The system of claim 1, further comprising a delay locked loop that provides a multi-phase signal based on a reference clock signal, the interpolator interpolating between an edge of the selected phase of the multi-phase signal from the preceding cycle and an edge of the selected phase of the multi-phase signal from the current cycle to provide an interpolated edge for a first phase in the set of adjusted phases for the current cycle.

10. A frequency synthesizer comprising the interpolation system of claim 9, the frequency synthesizer further comprising a selection system that is controlled to provide an output clock signal by selecting edges from the set of adjusted phases for the current cycle.

11. The frequency synthesizer of claim 10, wherein the interpolation system further comprising at least one other stage operative to provide a second set of adjusted phases for the current cycle that has a greater number of phases than the set of adjusted phases for the current cycle, the selection system employing the second set of adjusted phases for the current cycle to provide the output clock signal.

12. The system of claim 11, wherein the at least one other stage comprises: at least one interpolator that interpolates between respective pairs of the adjusted phases for the current cycle to provide a set of interpolated phases for the current cycle; and at least one delay system that delays the phases for the adjusted current cycle to provide a delayed set of adjusted phases for the current cycle, the delayed set of adjusted phases for the current cycle being combined with the set of interpolated phases for the current cycle to provide the second set of adjusted phases for the current cycle.

13. A system comprising:
 a delay locked loop that provides a multi-phase signal based on a reference clock signal; and
 an interpolation system, comprising:
 an interpolator that phase interpolates the multi-phase signal of a selected phase of the multi-phase signal from an adjacent preceding cycle and an edge of a selected phase of the multi-phase signal from the current cycle to provide an interpolated first phase of the current cycle of the multi-phase signal; and
 a delay system that delays the selected phase from the current clock cycle to correspond with the selected phase of the preceding clock cycle, the delay system further delaying a plurality of phases of the multi-phase signal to provide a plurality of delayed phases of the multi-phase signal, where the amount of delay of the other phases is configured to substantially match an amount of delay associated with the interpolation, the plurality of delayed phases and the interpolated first phase of the current cycle collectively defining an adjusted multi-phase signal for the current cycle, the adjusted multi-phase signal for the current cycle having reduced jitter relative to the multi-phase signal provided by the delay locked loop.

14. The system of claim 13, wherein the interpolator and the delay system define a first stage of the interpolation system, the interpolation system further comprising at least one other stage which comprises: at least one second interpolator that interpolates between respective pairs of the edges in the adjusted multi-phase signal for the current cycle to provide a set of interpolated phases for the current cycle; and at least one delay system that delays edges in the adjusted multi-phase signal to provide a delayed set of adjusted phases for the current cycle, the delayed set of adjusted phases for the current cycle being combined with the set of interpolated phases for the current cycle to provide a further adjusted multi-phase signal for the current cycle that has more phases than the adjusted multi-phase signal provided by the first stage of the interpolation system.

15. The system of claim 13, wherein the edge of each of the selected phases corresponds to a rising edge of a respective phase.

16. The system of claim 13, wherein the preceding cycle of the multi-phase signal and the adjusted multi-phase signal for the current cycle have an equal number of phases, the selected phase from the preceding cycle corresponding to a last phase of the preceding cycle and the selected phase from the current cycle corresponding to a second phase of the current cycle, such that the interpolation between the edge of the selected phase from the preceding cycle and the edge of the selected phase from the current cycle provides the first phase in the adjusted multi-phase signal for the current cycle.

17. The system of claim 13, further comprising a delay component that delays the selected phase of the multi-phase signal from the preceding cycle to provide a delayed phase from the preceding cycle, the interpolator interpolating between an edge of the delayed phase from the preceding cycle and the edge of the selected phase of the multi-phase signal from the current cycle to provide the interpolated edge for the first phase of the adjusted multi-phase signal for the current cycle.

18. A frequency synthesizer comprising the interpolation system of claim 13, the frequency synthesizer further comprising: a selection system that receives the adjusted multi-phase signal for the current cycle and is operative to provide an output clock signal having a frequency based on a control signal; and a control system that provides the control signal to select at least one phase from the adjusted multi-phase signal for the current cycle.

19. The frequency synthesizer of claim 18, wherein the interpolator and the delay system define a first stage of the interpolation system, the interpolation system further comprising at least one other stage that is operative to provide a second adjusted multi-phase signal for the current cycle that has a greater number of phases than the adjusted multi-phase signal for the current cycle provided by the first stage of the interpolation system.

20. A system comprising:
 means for phase interpolating the multi-phase signal between a selected phase from a an adjacent preceding cycle of a multi-phase signal and a phase from a current cycle of the multi-phase signal to provide an adjusted interpolated phase of the current cycle of the multi-phase signal; and
 means for delaying the selected phase from the current clock cycle to correspond with the selected phase of the preceding clock cycle, the means further delaying other phases of the multi-phase signal to provide a plurality of delayed phases for the current cycle of the multi-phase signal, where the amount of delay of the other phases is configured to substantially match an amount of delay associated with the interpolation, the plurality of delayed phases and the interpolated phase of the current cycle being combined to provide an adjusted multi-phase signal for the current cycle.

21. The system of claim 20, further comprising means for delaying the selected phase of the multi-phase signal from the preceding cycle to provide a delayed phase from the preceding cycle that has an edge substantially aligned with the edge of the phase from the current cycle of the multi-phase signal, the means for interpolating providing the adjusted edge for the interpolated phase of the multi-phase signal for the current cycle by interpolating between an edge of the delayed phase from the preceding cycle and the edge of the phase from the current cycle of the multi-phase signal.

22. The system of claim 20, further comprising means for generating the multi-phase signal.

23. The system of claim 20, further comprising means for further increasing a number of phases in the adjusted multi-phase signal for the current cycle.

24. The system of claim 23, further comprising means for providing an output signal having a desired frequency based on selecting phases from the adjusted multi-phase signal for the current cycle that is provided by the means for further increasing.

25. A method comprising:
  receiving a multi-phase signal having a plurality of phases, each of the plurality of phases having a respective edge that exhibits an amount of jitter;
  phase interpolating the multi-phase signal between a selected phase of an adjacent preceding cycle of the multi-phase signal and a selected phase of a current cycle to provide an interpolated edge that exhibits a reduced amount of jitter relative to the amount of jitter associated with the received multi-phase signal;
  delaying a selected phase from the current clock cycle to correspond with the selected phase of the preceding clock cycle; and
  delaying other phases of the multi-phase signal to provide a plurality of delayed phases for the current cycle of the multi-phase signal, where the amount of delay is configured to substantially match an amount of delay associated with the interpolation.

26. The method of claim 25, further comprising: aggregating the plurality of delayed phases of the current cycle and the interpolated phase of the current cycle to provide an aggregated multi-phase signal for the current cycle.

27. The method of claim 26, further comprising: interpolating between phases of the aggregated multi-phase signal to provide interpolated phases for the current cycle; delaying the phases of the aggregated multi-phase signal for the current cycle to provide corresponding delayed phases of the aggregated multi-phase signal for the current cycle; and aggregating the corresponding delayed phases of the aggregated multi-phase signal for the current cycle and the interpolated phases of the aggregated multi-phase signal for the current cycle to provide a second aggregated multi-phase signal for the current cycle that has a greater number of phases for the current cycle than the aggregated multi-phase signal for the current cycle.

28. The method of claim 27, further comprising generating a clock signal by selecting phases from the further aggregated multi-phase signal for the current cycle.

29. The method of claim 26, further comprising generating a clock signal by selecting phases from the aggregated multi-phase signal for the current cycle.

30. The method of claim 25, further comprising delaying the selected phase of the preceding cycle to provide a delayed phase from the preceding cycle, the interpolating being performed between an edge of the delayed phase from the preceding cycle and the edge of the selected phase of the current cycle to provide the interpolated edge for a first phase of the current cycle.

* * * * *

UNITED STATES PATENT AND TRADEMARK OFFICE
CERTIFICATE OF CORRECTION

PATENT NO. : 7,599,458 B2
APPLICATION NO. : 10/968735
DATED : October 6, 2009
INVENTOR(S) : Naffziger et al.

It is certified that error appears in the above-identified patent and that said Letters Patent is hereby corrected as shown below:

In column 3, line 29, after "edge" insert -- $E_{P\_M}$ --.

In column 3, lines 41, after "interpolated" insert -- phase $E_{C\_0}$ --.

In column 10, line 56, in Claim 20, after "from" delete "a".

Signed and Sealed this

Twenty-sixth Day of January, 2010

David J. Kappos
*Director of the United States Patent and Trademark Office*